United States Patent
Qi et al.

(10) Patent No.: US 6,829,160 B1
(45) Date of Patent: Dec. 7, 2004

(54) MAGNETIC RAM CELL WITH AMPLIFICATION CIRCUITRY AND MRAM MEMORY ARRAY FORMED USING THE MRAM CELLS

(75) Inventors: Quiqun (Kevin) Qi, Newark, CA (US); Xizeng (Stone) Shi, Fremont, CA (US); Matthew Gibbons, Livermore, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 10/079,116

(22) Filed: Feb. 20, 2002

Related U.S. Application Data
(60) Provisional application No. 60/281,936, filed on Apr. 6, 2001.

(51) Int. Cl.[7] ............................ G11C 11/00; G11C 5/06; G11C 11/15; G11C 7/00
(52) U.S. Cl. ........................ 365/158; 365/72; 365/173; 365/189.09; 365/189.11
(58) Field of Search ........................ 365/158, 72, 173, 365/189.09, 189.11

(56) References Cited

U.S. PATENT DOCUMENTS
6,201,259 B1 * 3/2001 Sato et al. ...................... 257/30
6,512,690 B1 * 1/2003 Qi et al. ...................... 365/171

FOREIGN PATENT DOCUMENTS
JP 11204854 A * 7/1999 ........... H01L/43/08

* cited by examiner

*Primary Examiner*—David Nelms
*Assistant Examiner*—Ly Duy Pham
(74) *Attorney, Agent, or Firm*—Sawyer Law Group LLP

(57) ABSTRACT

A magnetic random access memory (MRAM) cell and a memory array formed from the MRAM cells are disclosed. The MRAM cell includes a magnetic tunneling junction and a transistor. The magnetic tunneling junction includes a first ferromagnetic layer, a second ferromagnetic layer and an insulating layer between the first ferromagnetic layer and the second ferromagnetic layer. The gate of the transistor is coupled to a first end of the magnetic tunneling junction. The source of the transistor is coupled to a second end the magnetic tunneling junction. The drain of the transistor is coupled with an output for reading the magnetic memory cell. During reading, a read current is applied to the magnetic tunneling junction and the transistor is preferably operated in a saturation region.

9 Claims, 5 Drawing Sheets

MAGNETIC RAM CELL WITH AMPLIFICATION CIRCUITRY AND MRAM MEMORY ARRAY FORMED USING THE MRAM CELLS

CROSS-REFERENCE TO RELATED APPLICATION

This application is claiming under 35 U.S.C. §119(e) the benefit of provisional patent application Ser. No. 60/281,936, filed on Apr. 6, 2001.

FIELD OF THE INVENTION

The present invention relates to magnetic memory systems, and more particularly to a method and system for providing a magnetic memory cell and a memory array including the magnetic memory cells.

BACKGROUND OF THE INVENTION

Magnetic memories are often used in storing data. One type of memory currently of interest utilizes magnetic tunneling junctions in the memory cells. A magnetic tunneling junction typically includes two ferromagnetic layers separated by a thin insulating layer. The insulating layer is thin enough to allow charge carriers to tunnel between the ferromagnetic layers. The resistance of the magnetic tunneling junction depends upon the orientation of the magnetic tunneling junctions.

FIG. 1 depicts a conventional magnetic memory cell 10 as used in a conventional magnetic memory. The conventional memory cell 10 is coupled with a voltage supply line 20 and receives a current $I_r$ 18 during reading. The conventional memory cell 10 includes a magnetic tunneling junction 12 and a transistor 14. The magnetic tunneling junction 12 is represented by a resistor. The magnetic tunneling junction 12 is coupled to the drain of the transistor 14. The source of the transistor 14 is coupled to ground. The state of the magnetic tunneling junction 12, and thus the data stored by the conventional memory cell 10 is sensed by detecting the voltage at output 16. The output 16 is coupled to the magnetic tunneling junction 12 of the conventional memory cell 10.

FIG. 2 depicts a conventional memory array 30 using the conventional memory cell 10. The conventional array 30 is shown as including four conventional memory cells 10. The memory cells 10 are coupled to reading/writing column selection 32 via bit lines 34 and 36 and to row selection 50 via word lines 52 and 54. The bit lines are coupled to the magnetic tunneling junctions 12, while the word lines 52 and 54 are coupled to the gates of the transistors 14. Also depicted are digit lines 44 and 46 which carry current that applies a field to the appropriate conventional memory cells 10 during writing. The reading/writing column selection 32 is coupled to write current source 38 and read current source 40 which are coupled to a line 42 coupled to a supply voltage VDD 48. Also shown are current source $I_W$ 38 and $I_r$ 40 used in writing and reading, respectively, to the conventional memory cells 10. Also depicted are transistors 58 and 60 that are controlled using control line 62.

In order to write to the conventional memory cell 10, the write current $I_W$ 38 is applied to the bit line 34 or 36 selected by the writing/reading column selection 32. The read current $I_r$ 40 is not applied. Both word lines 52 and 54 are disabled. The transistors 14 in all memory cells are disabled. In addition, one of the digit lines 44 or 46 selected carries a current used to write to the selected conventional memory cell 10. The combination of the current in a digit line 44 or 46 and the current in a bit line 34 or 36 will write to the desired conventional memory cell 10. Depending upon the data written to the conventional memory cell 10, the magnetic tunneling junction will have a high resistance or a low resistance.

When reading from a conventional cell 10 in the conventional memory array 30, the write current $I_W$ 38 is disabled and the transistors 58 and 60 are turned off by controlling the control signal through the control line 62. The read current $I_r$ 40 is applied instead. The memory cell 10 selected to be read is determined by the row selection and column selection 32. The transistors 14 in the selected cell are on. The output voltage is read at the output line 56. For example, assuming that the resistance of the magnetic tunneling junction in a low (ferromagnetic layers polarized parallel) state is twenty kilo-ohms, that the magnetoresistance ratio is twenty percent, and that a read current used is ten microamps. In such a case, the output voltage would either be 240 mV or 200 mV. Thus, there is a forty millivolt difference in the signals output for different states of the conventional magnetic memory cell 10.

Although the conventional memory array 30 and the conventional memory cells 10 function, one of ordinary skill in the art will readily recognize that the difference in the signals output by the conventional memory cells 10 is relatively small. The difference in output signals between the two states of the conventional memory cell 10 is on the order of tens of millivolts. The output signals are typically on the order of a few hundred millivolts. As a result, the conventional memory cells 10 and the conventional memory array may be subject to errors.

Accordingly, what is needed is a system and method for providing a magnetic memory cell having an improved signal. The present invention addresses such a need.

SUMMARY OF THE INVENTION

The present invention provides a magnetic random access memory (MRAM) cell and a memory array formed from the MRAM cells. The MRAM cell includes a magnetic tunneling junction and a transistor. The magnetic tunneling junction includes a first ferromagnetic layer, a second ferromagnetic layer and an insulating layer between the first ferromagnetic layer and the second ferromagnetic layer. The transistor has a source, a drain and a gate. The gate of the transistor is coupled to a first end of the magnetic tunneling junction. The source of the transistor is coupled to a second end the magnetic tunneling junction. The drain of the transistor is coupled with an output for reading the magnetic memory cell.

According to the system and method disclosed herein, the present invention provides a magnetic memory having an amplified output signal.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a magnetic random access memory (MRAM) cell and a memory array formed from the MRAM cells. The MRAM cell includes a magnetic tunneling junction and a transistor. The magnetic tunneling junction includes a first ferromagnetic layer, a second ferromagnetic layer and an insulating layer between the first ferromagnetic layer and the second ferromagnetic layer. The transistor has a source, a drain and a gate. The transistor is preferably a metal-oxidation-semiconductor field effect transistor (MOSFET) including a source, a drain and a gate. However, other types of transistors, such as junction FET (JFET), bipolar transistors or other transistors could also be used. The gate of the transistor is coupled to a first end of the magnetic tunneling junction. The source of the transistor is coupled to a second end the magnetic tunneling junction. The drain of the transistor is coupled with an output for reading the magnetic memory cell.

The present invention will be described in terms of a particular memory array having certain magnetic memory cells. However, one of ordinary skill in the art will readily recognize that this method and system will operate effectively for other memory arrays having other or additional components in the magnetic memory cells not inconsistent with the present invention. For example, the present invention can be used with other magnetic tunneling junctions not inconsistent with the present invention.

Figure 3:
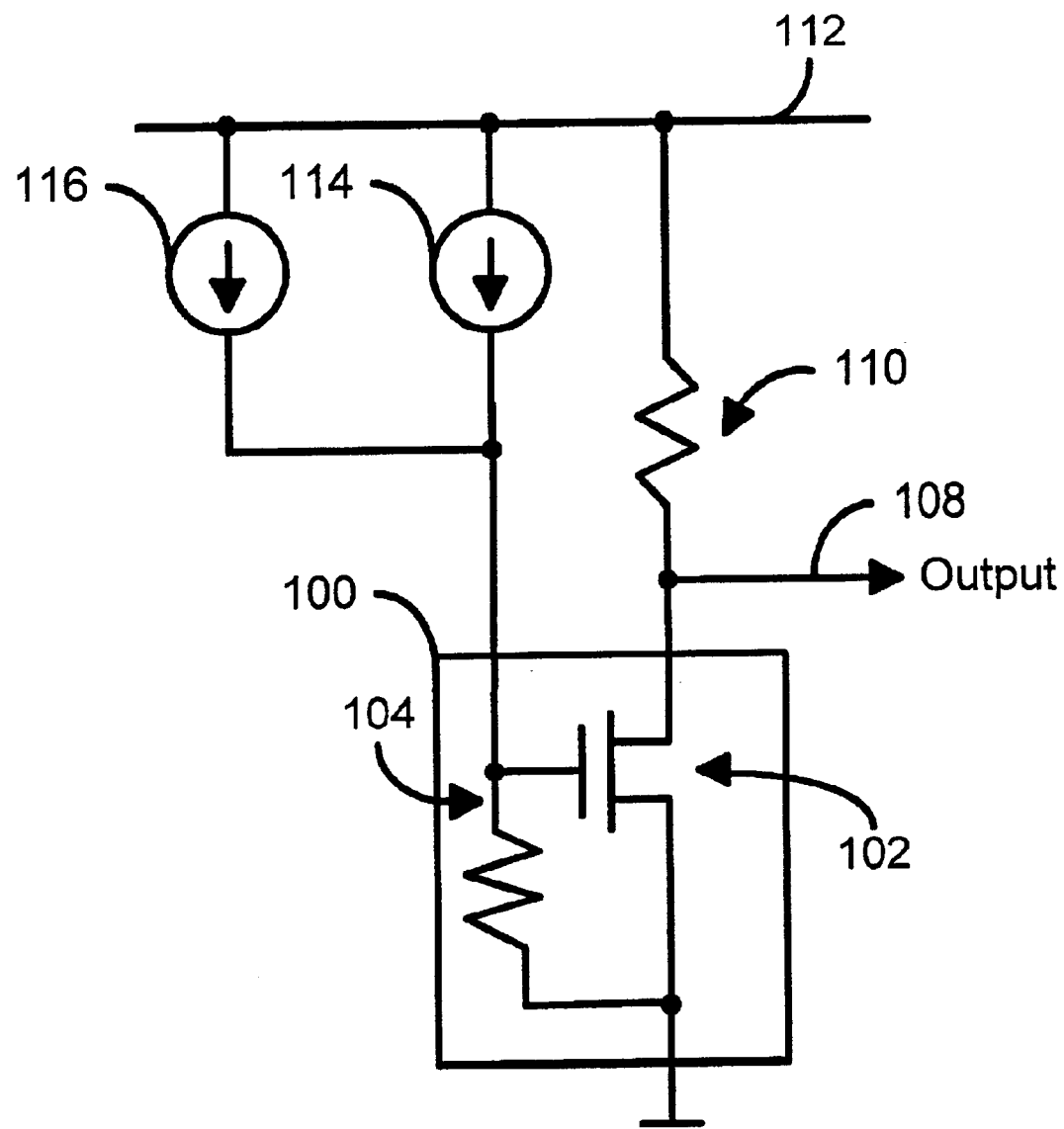
FIG. 3 is a diagram of one embodiment of a magnetic memory cell in accordance with the present invention.

To more particularly illustrate the method and system in accordance with the present invention, refer now to FIG. 3, depicting one embodiment of a magnetic memory cell 100 in accordance with the present invention. The memory cell 100 includes a transistor 102 and a magnetic tunneling junction 104. The magnetic tunneling junction 104 preferably includes two ferromagnetic layers separated by a thin insulating layer. The insulating layer is preferably thin enough to allow charge carriers to tunnel between the ferromagnetic layers. The transistor 102 is preferably a MOSFET and has a source, a drain and a gate. The magnetic tunneling junction 104 is coupled to the gate and the source of the transistor 102 and with ground. The drain of the transistor 102 is coupled with an output line 108. The output line 108 is used to read the memory cell 100. Also shown is a load 110, a supply voltage 112 and current sources 114 and 116. The load 110 that is coupled between the memory cell 100 and the supply voltage 112. The load 110 may be a resistor, a transistor, or any type of device that can be used as an active load. The read current source 114 is used for reading. During writing, the write current source 116 and a digit line current source (not shown in FIG. 3) are used to change the state of the magnetic tunneling junction 104 to write data to the memory cell 100.

In operation, the resistance of the magnetic tunneling junction 104 changes depending on the state of the magnetic tunneling junction 104. In addition, the transistor 102 is preferably operated in the saturation region. The magnetic tunneling junction 104 is preferably set to be in either a low resistance or a high resistance state. During read mode, the current $I_r$ is applied to the magnetic tunneling junction 104 from the read current source 114. When the magnetic tunneling junction 104 is in a low resistance state, a voltage $R_{low}I_R$ is developed across the magnetic tunneling junction 104 and thus applied to the gate of the transistor 102. This voltage is relatively low because the magnetic tunneling junction 104 is in the low resistance state. The transistor 102 is thus either off or barely on when the magnetic tunneling junction 104 is in a low resistance state. As a result, little or no current flows through the load 110. The voltage developed on the output line 108 is, therefore, close to the supply voltage 112. Consequently, when the magnetic tunneling junction 104 is in a low resistance state, a high voltage is output.

In contrast, when the magnetic tunneling junction 104 is in a high resistance state, a voltage $R_{high}I_R$ is developed across the magnetic tunneling junction 104 and applied to the gate of the transistor 102. Because the magnetic tunneling junction 104 is in a high resistance state, this voltage is relatively large. The transistor 102 is thus on, and current flows through the load 110. The voltage developed at the output line 108 is the supply voltage minus the voltage developed across the load 110. The voltage across the load is the resistance of the load 110 multiplied by the current through the load 110. This current, $I_{ds}$, is the current that flows through the transistor 102 (from the drain to the source of the transistor 102). The combination of the resistance, R, of the load 110 and the current, $I_{ds}$, through the load can be selected such that the voltage ($RI_{ds}$) developed across the load 110 is close to the supply voltage. As a result, the voltage output over the output line 108 can be made small and/or close to zero when the magnetic tunneling junction 104 is in a high resistance state.

Figure 1:
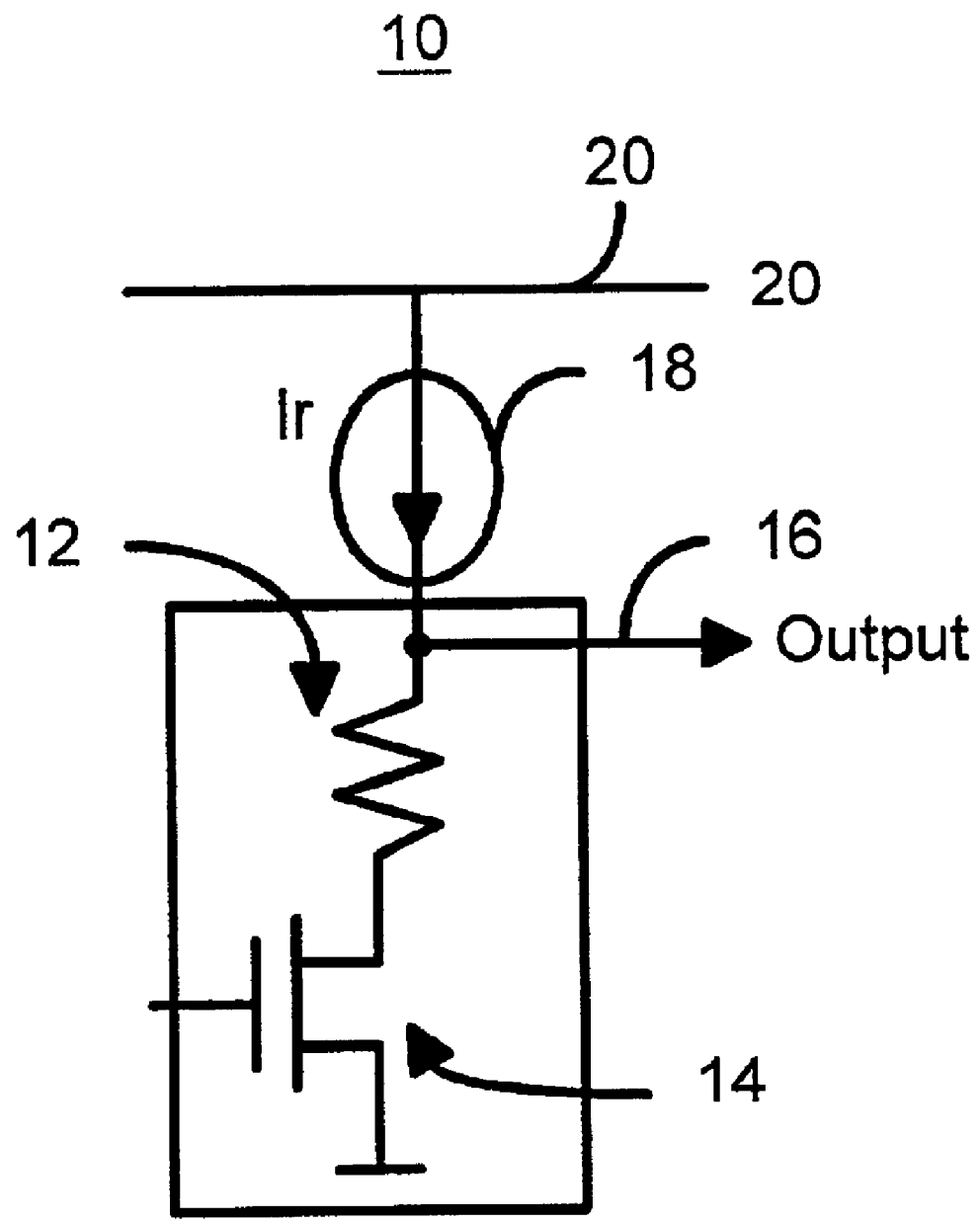
FIG. 1 is a diagram of a conventional magnetic memory cell.
Figure 2:
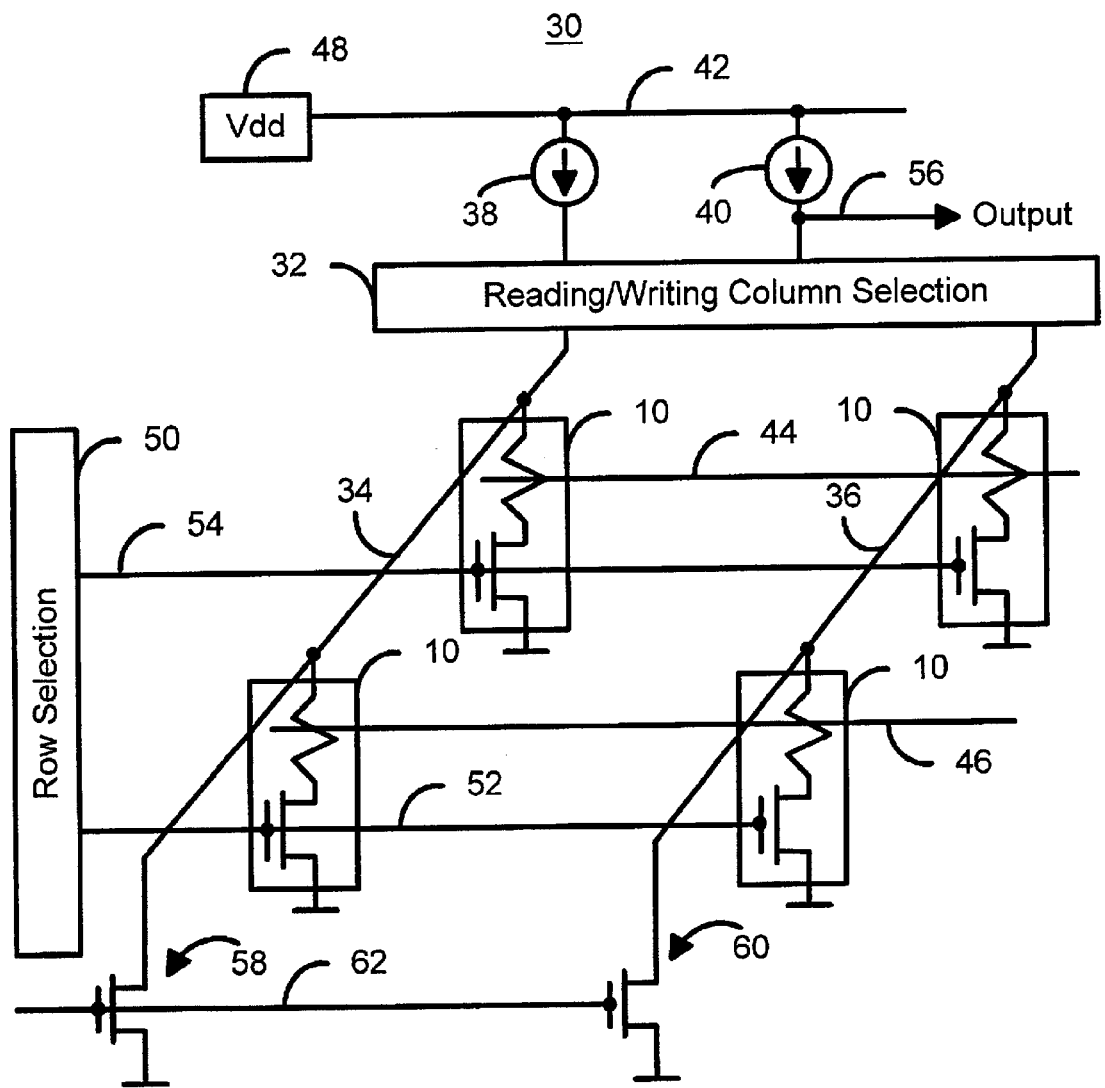
FIG. 2 is a diagram of a conventional memory array that utilizes the conventional magnetic memory cell.

Thus, the output of the magnetic memory cell 100 is very different in a low resistance state (close to supply voltage) than in a high resistance state (close to zero volts). There is, therefore, a large difference in the signal output from the memory cell 100 in a high resistance state than in a low resistance state. Because the output of the magnetic memory cell 100 is significantly larger than the voltage across the magnetic tunneling junction 104, the magnetic memory cell 100 can be seen as including amplification circuitry. This signal from the magnetic memory cell 100 is significantly larger than the tens of millivolt difference in the signals output for different states of the conventional magnetic memory cell 10 described in FIGS. 1 and 2.

Figure 4:
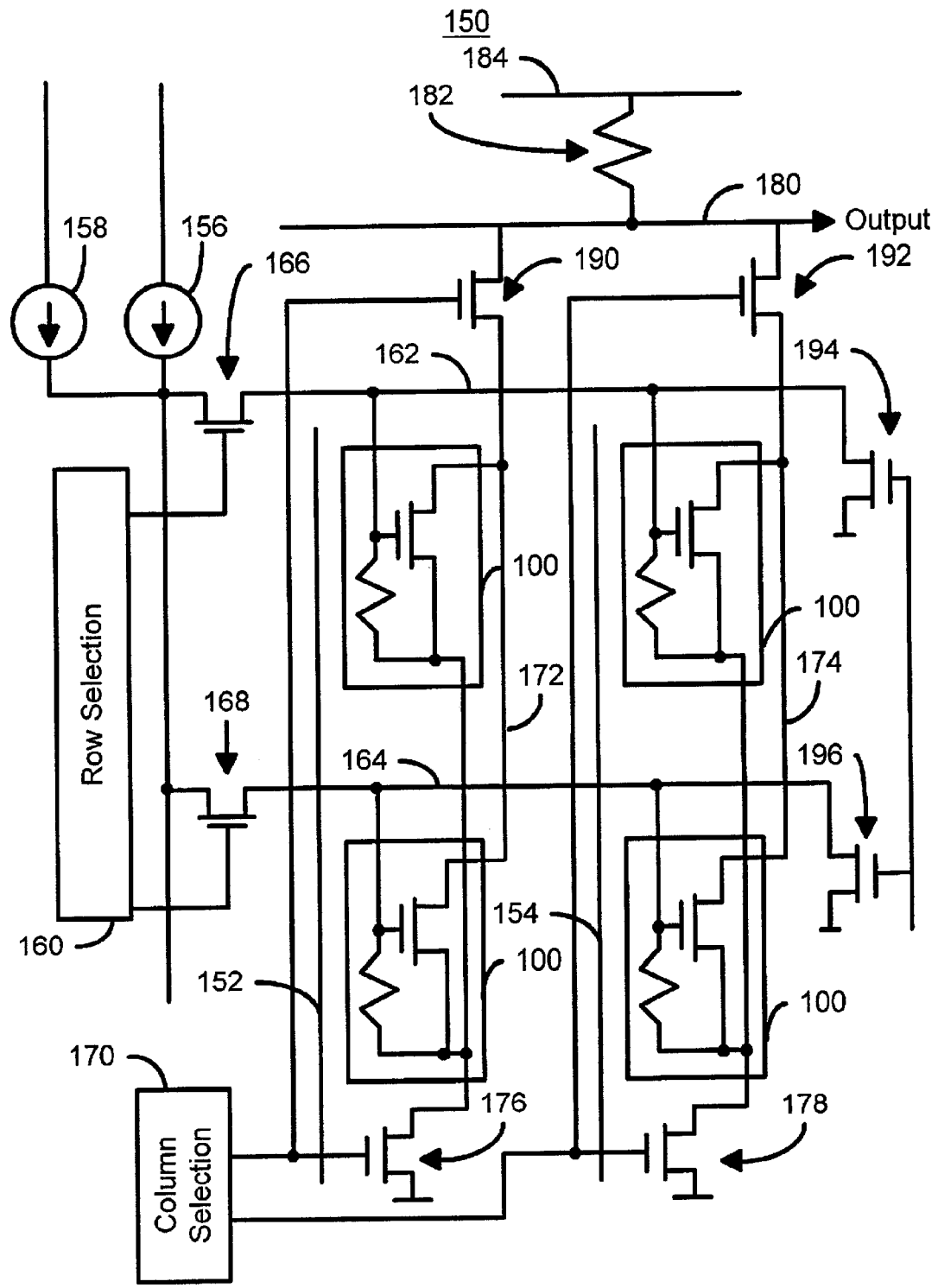
FIG. 4 is a diagram of one embodiment of a memory array using one embodiment of a magnetic memory cell in accordance with the present invention.

FIG. 4 is a diagram of one embodiment of a memory array 150 using one embodiment of the magnetic memory cell 100 in accordance with the present invention. The memory array 150 is depicted as having four memory cells 100. However, another number of memory cells is typically used. The memory array 150 includes a row selection 160 and a column selection 170. Also depicted are read current source $I_r$, 156 and write current source $I_W$ 158. The row selection 160 is coupled to the gates of the transistors 166 and 168. The source and drains of the transistors 166 and 168 are coupled to the word lines 162 and 164, respectively, and current sources 156 and 158, respectively. The row selection 160 determines which row in the memory array 150 is selected. The word lines 162 and 164 are coupled to the gates of the transistors 102 and one end of the magnetic tunneling junctions 104 in the memory cells 100 in rows of the memory array 150. The memory array 150 also includes column selection 170. The column selection 170 determines which column is selected. Each of the outputs of the column selection 170 is coupled with gates of a pair of transistors, transistors 176 and 190 or 178 and 192. The drains of the transistors 176 and 178 are coupled to the sources of the transistors 102 and the opposite ends of the magnetic tunneling junctions 104 in memory cells 100 in columns of the memory array 150. The transistors 190 and 192 connect the bit lines 172 and 174, which are coupled to the drains of the transistors 102 in the selected columns, to the output line 180. The output line 180 is also coupled to the supply voltage line Vdd 184 via load 182. Also depicted are digit lines 152 and 154. The magnetic tunneling junctions 104 are coupled to the gates of the transistors 102 at one end and to the sources of the transistors 102 and the drains of transistors 176 and 178 at the other end. Also depicted are transistors 194 and 196. The drain of each transistor 194 or 196 is connected to one of the word lines 162 and 164.

Figure 5A:
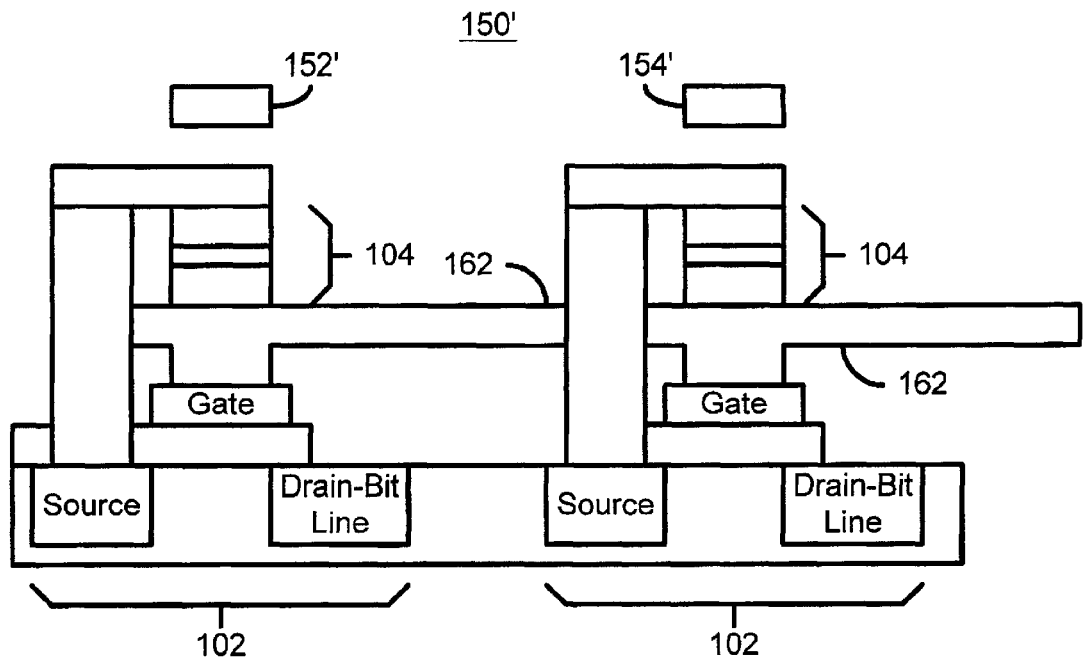
FIG. 5 is a diagram of a cross-sectional presentation of one embodiment of a memory array using one embodiment of a magnetic memory cell in accordance with the present invention.
Figure 5B:
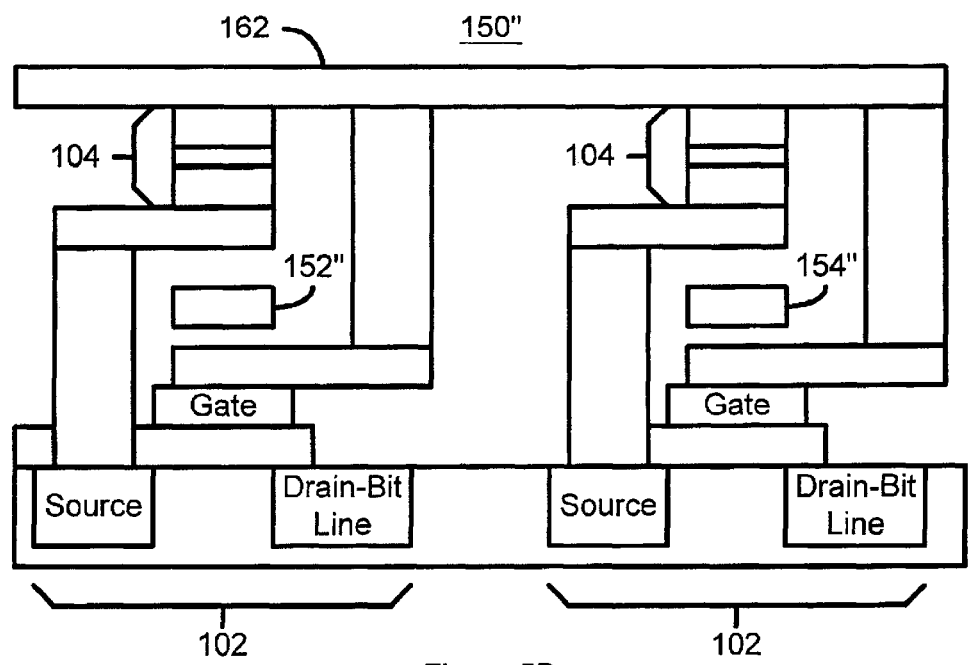

Note that although the digit lines 152 and 154 are depicted as being to the side of the magnetic tunneling junctions 104, the digit lines 152 and 154 preferably physically reside right under or above the magnetic tunneling junction. FIGS. 5A and 5B depict embodiments of a cross-sectional view of two memory cells 100 in arrays 150' and 150", respectively. FIGS. 5A and 5B depict the position of the digit lines 152' and 154' and 152" and 154", respectively, as just above and below, respectively, the magnetic tunneling junctions 100. When writing, the current in the word line 162 flows from left to right or right to left. Current in the digit line 152', 154', 152" or 154" flows into or out of the paper, as shown in FIGS. 5A and 5B. Other than the positions of the digit lines 152', 154', 152" and 154", the memory arrays 150' and 150" function as described with respect to FIG. 4.

Referring back to FIG. 4, in operation, the row selection 160 selects a row for reading by providing voltages to the gates of the transistors 166 and 168 such that one of the transistors 166 or 168 is on while the other is off. The word line 162 or 164 connected to the transistor 166 or 168 that is turned on is selected. The transistors 194 and 196 are all off. In addition, a read current, $I_r$, is applied via the current source 156 while the write current $^1$, is disabled. The read current IT 156 will flow to the word line 162 or 164. The column selection 170 selects a bit line 172 or 174 to read from by applying voltages to the gates of each pair of transistors 176 and 190, and 178 and 182 such that one pair of the transistors 176 and 190 or 178 and 192 are on while another pair is off. The read current Ir will flow through the selected transistor 166 or 168 and the selected word line 162 or 164 to the selected magnetic tunneling junction 104 in the memory cell 100, the selected transistor 176 or 178 to ground. The output is read on output line 180. Because of the arrangement of the transistor 102 and the magnetic tunneling junction 104 in the memory cell 100, discussed above, the voltage developed on the output line 180 is relatively large. In particular, as discussed above, the signal from the magnetic tunneling junction 104 is put over the output line 180, as described above.

During writing, transistors 194 and 196 are turned on by providing a high voltage to transistor 194 and 196. The read current source 156 is disabled, while the write current source 158 is enabled. Similarly, during writing, a write current from the write current source 158 flows through a selected word line 162 or 164 and the transistor 194 or 196, respectively, to ground. The word lines 162 and 164 are selected using the row selection 160 and the transistors 162 and 164, as described above for reading. Simultaneously, the digit line 152 or 154 carries a current that flows through the digit line 152 or 154. This current flows substantially perpendicular to the flow of current in the word line 162 or 164. The cell 100 residing in the selected row and column is written using the combination of the write current from the write current source 158 and the write current through the digit line 152 or 154. Depending upon the direction of flow of the current in the digit line 152 or 154 (i.e. upwards or downwards as shown in FIG. 4), the state of the magnetic tunneling junction is set to be a low resistance or a high resistance. Thus, the array 150 utilizes the memory cells 100. In order to do so, the memory array 150 applies a voltage to the gates of the transistors 102 in the selected cell. Because the memory array 150 can utilize the memory cells 100, the memory array 150 can provide a larger difference in output signals for different states of the memory cells 100. Consequently, the memory array 150 is more reliable.

Consequently, the memory cell 100 and memory array 150 have a larger signal and are thus more reliable. In addition, the memory array 150 may has simple circuitry.

A method and system has been disclosed for a magnetic memory cell, a magnetic memory array and a method for utilizing the memory cell and array. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory cell comprising:
   a magnetic tunneling junction including a first ferromagnetic layer, a second ferromagnetic layer and an insulating layer between the first ferromagnetic layer and the second ferromagnetic layer; and
   a transistor having a source, a drain and a gate, the gate of the transistor being coupled to a first end of the magnetic tunneling junction, the source of the transistor being coupled to a second end the magnetic tunneling junction, the drain of the transistor being coupled with an output for reading the magnetic memory cell.

2. The magnetic memory cell of claim 1 wherein the transistor is a MOSFET or another type of transistor.

3. The magnetic memory cell of claim 1 wherein a second end of the magnetic tunneling junction and the source of the transistor are coupled to ground.

4. The magnetic memory cell of claim 1 wherein the transistor is operated in a saturation region during reading.

5. A magnetic memory comprising:
   a plurality of memory cells arranged in an array including a plurality of rows and a plurality of columns, each of the plurality of memory cells including a magnetic tunneling junction and a transistor having a source, a drain and a gate, the gate of the transistor being coupled to a first end of the magnetic tunneling junction, the source of the transistor being coupled to a second end of the magnetic tunneling junction, the drain of the transistor being coupled with an output for reading the magnetic memory cell;
   a plurality of row lines coupled to the plurality of rows, the plurality of row lines coupled to gate of the transistor in each of the plurality of memory cells in the plurality of rows;
   a row selector coupled to the plurality of row lines for selecting between the plurality of row lines and providing a current to a selected row of the plurality of rows.

6. The magnetic memory of claim 5 further comprising:

a first plurality of column lines coupled to the plurality of columns, the plurality of columns lines coupled to source of the transistor in each of the plurality of memory cells in the plurality of columns;

a second plurality of column lines coupled to the plurality of columns, the second plurality of column lines coupled to the drain of the transistor in each of the plurality of memory cells in the plurality of columns, each of the first plurality of columns lines coupled to a particular column, a corresponding column line of the second plurality of column lines coupled to the particular column line, each of the first plurality of column lines and the corresponding column line of the second plurality of column lines forming a pair of column lines;

a column selector coupled to the first plurality of column lines and the second plurality of column lines for selecting between the first plurality of column lines and the second plurality of column lines to select a pair of column lines.

7. The magnetic memory of claim 5 further comprising:

a plurality of digit lines for providing a current for writing to a portion of the plurality of memory cells.

8. The magnetic memory of claim 6 further comprising a load coupled to the plurality of column lines.

9. The magnetic memory of claim 5 wherein the transistor is operated in a saturation region during reading.

\* \* \* \* \*